(12) United States Patent
Fuergut et al.

(10) Patent No.: US 12,002,739 B2
(45) Date of Patent: Jun. 4, 2024

(54) SEMICONDUCTOR DEVICE INCLUDING AN EMBEDDED SEMICONDUCTOR DIE

(71) Applicant: Infineon Technologies Austria AG, Villach (AT)

(72) Inventors: Edward Fuergut, Dasing (DE); Achim Althaus, Regensburg (DE); Martin Gruber, Schwandorf (DE); Marco Nicolas Mueller, Villach (AT); Bernd Schmoelzer, Radenthein (AT); Wolfgang Scholz, Olching (DE); Mark Thomas, Bodensdorf (AT)

(73) Assignee: Infineon Technologies Austria AG, Villach (AT)

( * ) Notice: Subject to any disclaimer, the term of this patent is extended or adjusted under 35 U.S.C. 154(b) by 108 days.

(21) Appl. No.: 17/173,757

(22) Filed: Feb. 11, 2021

(65) Prior Publication Data

US 2021/0249334 A1    Aug. 12, 2021

(30) Foreign Application Priority Data

Feb. 12, 2020 (EP) .................................. 20156858

(51) Int. Cl.
| | |
|---|---|
| *H01L 23/485* | (2006.01) |
| *H01L 21/56* | (2006.01) |
| *H01L 23/31* | (2006.01) |
| *H01L 23/13* | (2006.01) |
| *H01L 23/14* | (2006.01) |
| *H01L 23/495* | (2006.01) |
| *H01L 23/498* | (2006.01) |

(52) U.S. Cl.
CPC ............ *H01L 23/485* (2013.01); *H01L 21/56* (2013.01); *H01L 23/3135* (2013.01); *H01L 23/13* (2013.01); *H01L 23/142* (2013.01); *H01L 23/49548* (2013.01); *H01L 23/49861* (2013.01)

(58) Field of Classification Search
CPC ........................... H01L 23/485; H01L 23/3135
USPC .......................................................... 257/666
See application file for complete search history.

(56) References Cited

U.S. PATENT DOCUMENTS

| | | | |
|---|---|---|---|
| 2010/0213599 A1 | 8/2010 | Watanabe et al. | |
| 2011/0187002 A1* | 8/2011 | Kishii | H01L 23/488 |
| | | | 257/E23.116 |
| 2012/0273941 A1* | 11/2012 | Zeng | H01L 23/13 |
| | | | 257/737 |
| 2014/0231980 A1 | 8/2014 | Lim et al. | |
| 2015/0076672 A1 | 3/2015 | Hosseini et al. | |
| 2015/0325552 A1 | 11/2015 | Liu | |
| 2016/0268190 A1* | 9/2016 | Mcknight-Macneil | |
| | | | H01L 21/78 |

(Continued)

FOREIGN PATENT DOCUMENTS

| | | |
|---|---|---|
| EP | 2980847 A1 | 2/2016 |
| JP | 2002110862 A | 4/2002 |

*Primary Examiner* — Quoc D Hoang
(74) *Attorney, Agent, or Firm* — Murphy, Bilak & Homiller, PLLC

(57) ABSTRACT

A semiconductor device includes a die carrier, a semiconductor die disposed on a main face of the die carrier, the semiconductor die including one or more contact pads, an encapsulant covering at least partially the semiconductor die and at least a portion of the main face of the die carrier, an insulation layer covering the encapsulant, and one or more electrical interconnects, each being connected with one of the one or more contact pads of the semiconductor die and extending through the encapsulant.

18 Claims, 11 Drawing Sheets

(56) References Cited

U.S. PATENT DOCUMENTS

2017/0148746 A1    5/2017   Chiu et al.
2018/0096946 A1    4/2018   Meyers et al.
2018/0190622 A1*   7/2018   Lin .................... H01L 23/4952
2018/0315674 A1*   11/2018  Chen .................... H01L 23/481

* cited by examiner

SEMICONDUCTOR DEVICE INCLUDING AN EMBEDDED SEMICONDUCTOR DIE

TECHNICAL FIELD

The present disclosure is related in general to semiconductor devices, in particular to semiconductor power devices. The present disclosure is in particular related to a semiconductor device comprising an embedded semiconductor die disposed on a leadframe based die carrier and a method for fabricating such a semiconductor device.

BACKGROUND

Chip embedding is a solution where an active or passive component is positioned in between at least two layers of a printed circuit board. Today it is commonly used for low voltage signal processing systems, there are first attempts to apply embedding for power circuits with low voltages <100V, but for high voltages special challenges are to be expected in connection with the high electric fields. The motivations for doing that are manifold, e.g. increasing power density, extreme low parasitic inductances, better EMI shielding, and also high reliability and high power cycling robustness. Also chip embedding usually employs chemically plated, in particular electroplated, electrical interconnects, which are superior over other types of electrical interconnects.

A solution for manufacturing a chip embedded high voltage semiconductor device is to place the die on a leadframe, singulate the dies on leadframe and embed this assembly afterwards. One risk of the embedding technology is the interaction of the devices with the used carrier material where one dominant mechanism among other things is the voltage and the resulting electric field. This can lead in worst case to a destruction of the assembly caused by e.g. copper migration. Another threat is the exposed copper metallization on the die. Oxidation of this must be treated special in the embedding process. After the placement of the component, the connection to the outer layers is done through vias. Especially the passage from the via to the die metallization is a critical point for cracks. In addition there is a strong interaction of the embedding encapsulation material and the fabrication process in combination with high voltage devices and resulting electric field, causing chemical degradation of encapsulation material (e.g. pentode, reversible drifts), voltage drift of the device by ions from encapsulation material, corrosion of the device. Embedding material is also sensible to humidity and cannot guarantee density to the covered chips which accelerates the negative effects just described. To prevent delamination of the surrounding layers cavities in the leadframe are used, where the die is placed afterwards. Following this approach for each die a dedicated cavity must be done.

SUMMARY

A first aspect of the present disclosure is related to a semiconductor device comprising a die carrier, a semiconductor die disposed on the die carrier, the semiconductor die comprising one or more contact pads on a main face thereof, an encapsulant covering at least partially the semiconductor die and at least a portion of the main face of the die carrier, and an insulation layer covering the encapsulant, and one or more electrical interconnects each being connected with one of the contact pads of the semiconductor die and extending through the encapsulant.

A second aspect of the present disclosure is related to a method for fabricating a semiconductor device, the method comprising providing a die carrier, disposing a semiconductor die on a main face of the die carrier, the semiconductor die comprising one or more contact pads on a main face thereof, applying an encapsulant at least partially to the semiconductor die and at least a portion of the main face of the die carrier, applying an insulation layer to the encapsulant; and fabricating electrical interconnects by forming openings into the encapsulant and the insulation layer and filling a conductive material into the openings.

A third aspect of the present disclosure is related to a method for fabricating a semiconductor device, the method comprising providing a die carrier, disposing a semiconductor die on a main face of the die carrier, the semiconductor die comprising one or more contact pads on a main face thereof, disposing first electrical interconnects on the one or more contact pads of the semiconductor die, applying an encapsulant at least partially to the semiconductor die and at least a portion of the main face of the die carrier, applying an insulation layer to the encapsulant, and fabricating second electrical interconnects by forming openings into the insulation layer and filling a conductive material into the openings.

BRIEF DESCRIPTION OF THE DRAWINGS

The accompanying drawings are included to provide a further understanding of embodiments and are incorporated in and constitute a part of this specification. The drawings illustrate embodiments and together with the description serve to explain principles of embodiments. Other embodiments and many of the intended advantages of embodiments will be readily appreciated as they become better understood by reference to the following detailed description.

The elements of the drawings are not necessarily to scale relative to each other. Like reference numerals designate corresponding similar parts.

DETAILED DESCRIPTION

In the following detailed description, reference is made to the accompanying drawings, which form a part hereof, and in which is shown by way of illustration specific embodiments in which the disclosure may be practiced. In this regard, directional terminology, such as "top", "bottom", "front", "back", "leading", "trailing", etc., is used with reference to the orientation of the Figure(s) being described. Because components of embodiments can be positioned in a number of different orientations, the directional terminology is used for purposes of illustration and is in no way limiting. It is to be understood that other embodiments may be utilized and structural or logical changes may be made without departing from the scope of the present disclosure. The following detailed description, therefore, is not to be taken in a limiting sense, and the scope of the present disclosure is defined by the appended claims.

It is to be understood that the features of the various exemplary embodiments described herein may be combined with each other, unless specifically noted otherwise.

As employed in this specification, the terms "bonded", "attached", "connected", "coupled" and/or "electrically connected/electrically coupled" are not meant to mean that the elements or layers must directly be contacted together; intervening elements or layers may be provided between the "bonded", "attached", "connected", "coupled" and/or "electrically connected/electrically coupled" elements, respectively. However, in accordance with the disclosure, the above-mentioned terms may, optionally, also have the specific meaning that the elements or layers are directly contacted together, i.e. that no intervening elements or layers are provided between the "bonded", "attached", "connected", "coupled" and/or "electrically connected/electrically coupled" elements, respectively.

Further, the word "over" used with regard to a part, element or material layer formed or located "over" a surface may be used herein to mean that the part, element or material layer be located (e.g. placed, formed, deposited, etc.) "indirectly on" the implied surface with one or more additional parts, elements or layers being arranged between the implied surface and the part, element or material layer. However, the word "over" used with regard to a part, element or material layer formed or located "over" a surface may, optionally, also have the specific meaning that the part, element or material layer be located (e.g. placed, formed, deposited, etc.) "directly on", e.g. in direct contact with, the implied surface.

Figure 1A:
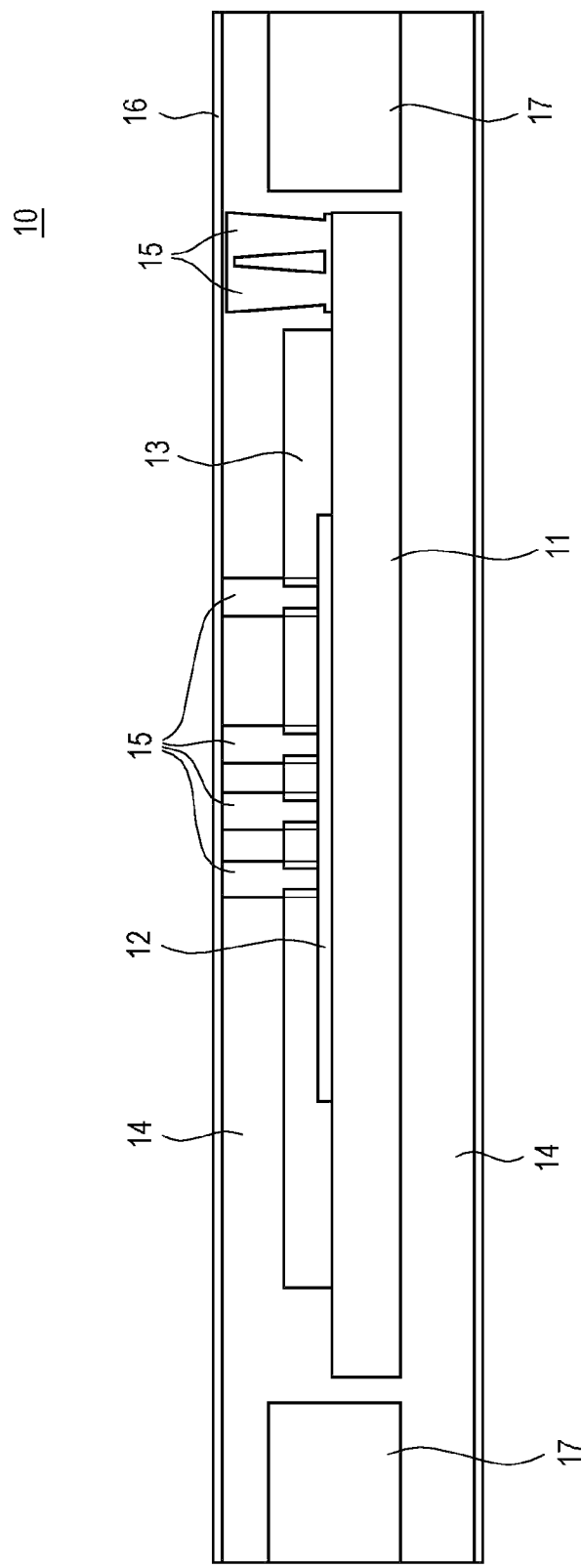
FIGS. 1A to 1D show schematic cross-sectional side view representations of an exemplary semiconductor device according to the first aspect, wherein the die carrier comprises a planar upper surface and the semiconductor die is disposed on the upper planar surface, and the encapsulant is disposed on the semiconductor die and only a portion of the upper planar surface of the die carrier (FIG. 1A), and a few first steps for fabricating the semiconductor device (FIGS. 1B to 1D).
Figure 1B:
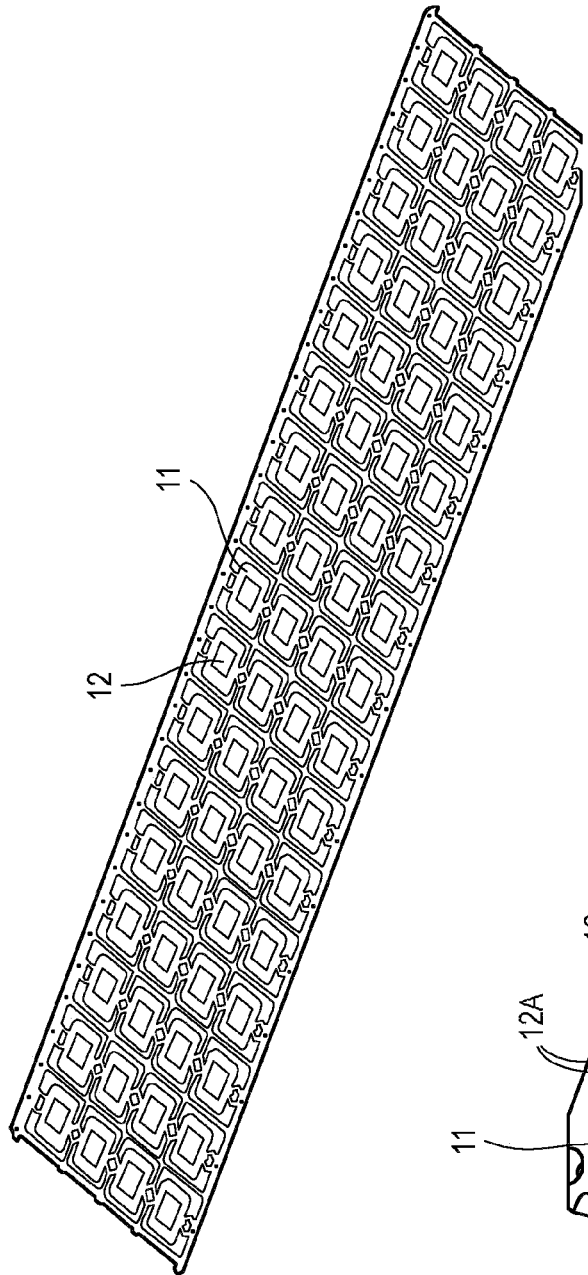
Figure 1D:
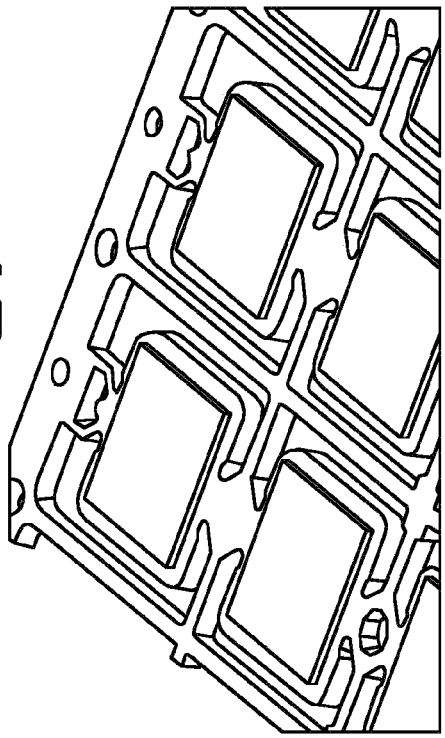
Figure 1C:
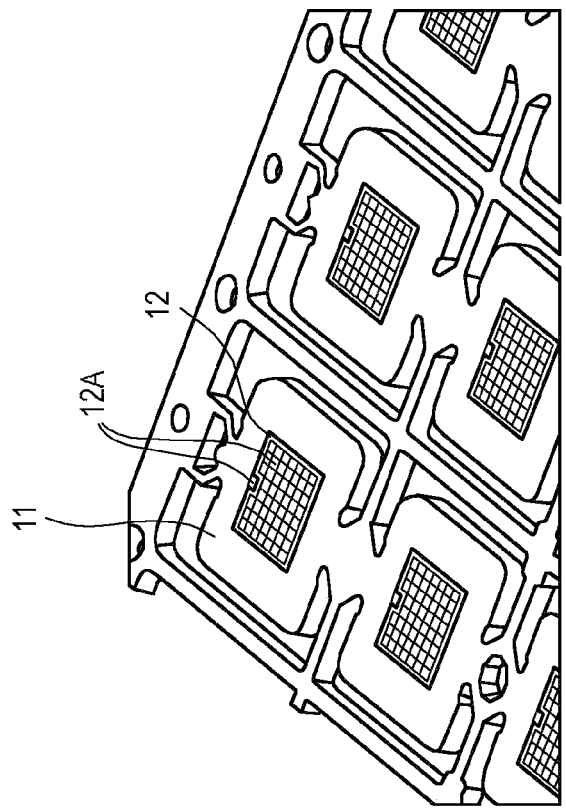

FIGS. 1A to 1D show schematic cross-sectional side view representations of an exemplary semiconductor device (FIG. 1A), and a few first steps for fabricating the semiconductor device (FIGS. 1B to 1D).

FIG. 1A shows a semiconductor device 10 which comprises a leadframe based die carrier 11, a semiconductor die 12 disposed on a first upper main face of the die carrier 11, the semiconductor die 12 comprising one or more contact pads 12A (not shown) on a main face thereof, an encapsulant 13 covering the semiconductor die 12 and a portion of the main face of the die carrier 11. The semiconductor device 10 further comprises an insulation layer 14 covering the encapsulant 13 and a portion of the first upper main face and a second lower main face of the die carrier 11, and a plurality of electrical interconnects 15 each one being connected with its lower end with one of the contact pads of the semiconductor die 12 and extending through the encapsulant 13 and the insulation layer 14. At their upper ends the electrical interconnects 15 are connected with metallic traces which are provided on a metallization layer 16 disposed on top of the insulation layer 14. The die carrier 11 is also connected by electrical interconnects 15 with one of the metallic traces 16A. It is alternatively possible that the die carrier 11 is contacted by electrical interconnects reaching via the backside portion of the insulation layer 14.

The embodiment of a semiconductor device as shown in FIGS. 1A to 1D is configured such that the die carrier 11 is disposed within an opening portion of a PCB 17 and the insulation layer 14 covers the encapsulant 13 on its upper main face and on its side faces and furthermore reaches through a space between side faces of the die carrier 11 and side faces of the PCB 17 to the backsides of the die carrier 11 and the PCB 17. The electrical interconnects 15 not only extend through the encapsulant 13 but also through a portion of the insulation layer 14 which is disposed on the upper surface of the encapsulant 13. As shown in FIG. 1A, there can also be electrical interconnects 15 which only extend through the insulation layer 14, in particular those which connect the die carrier with one of the metallic traces 16A.

According to an embodiment of the semiconductor device of FIGS. 1A to 1D, the encapsulant 13 comprises one or more of a resin, an epoxy resin, a polyimide, and a silicone. The encapsulant 13 may contain filler materials like filler particles with which the thermal conductivity may be increased. If the encapsulant 13 shall be laser structured, it would be preferable to use rather small filler particles, e.g. in a range from 10 to 50 μm diameter, so that also vias with small diameters can be laser structured. In particular, the type of material of the encapsulant 13 can be selected according to the properties of the semiconductor die 12, in particular, the voltage range of the semiconductor die 12. It is therefore possible to employ semiconductor dies with voltages above 100V by choosing an appropriate encapsulant material with sufficient isolation properties. The aggregate state of the applied encapsulant can be any one of pellets, granulate, powder, liquid, or a sheet.

According to an embodiment of the semiconductor device according to the first aspect, the encapsulant 13 completely covers the upper main face and the side faces of the semiconductor die 12 as is shown in the embodiment of FIG. 1A.

According to another embodiment of the semiconductor device according to the first aspect, the encapsulant 13 only partially covers the upper main face of the semiconductor die 12. In particular, it is possible that for reasons of edge termination and avoidance of high electric fields the encapsulant 13 only covers the upper surface of the semiconductor die 12 in the edge regions and possibly the side faces but not in a central region of the upper surface. The central region can instead be filled by the insulation layer 14, e.g. laminated by the insulation layer 14. Moreover, in such an embodiment the encapsulant 13 can be applied to the edge regions by dispensing, casting, or even an underfill dispensing. Furthermore it should be noted that this embodiment can also be applied in the further embodiments shown and explained in connection with FIGS. 2A, 3A, 4A, and 5.

According to an embodiment of the semiconductor device of FIGS. 1A to 1D, the semiconductor die 12 is connected to the die carrier by soldering, in particular diffusion soldering, or sintering, or by the use of glue, in particular a conductive glue like silver glue.

According to an embodiment of the semiconductor device of FIGS. 1A to 1D, the semiconductor die 12 can be one or more of vertical transistor die, a MOSFET die, an IGBT die, a SiC-MOS Die, a Cool-MOS die, an S-FET die, a gate driver die, a controller, or a connectivity die configured to connect the semiconductor device to external entities. A connectivity die can be, for example, a WiFi module or a USB interface.

According to an embodiment of the semiconductor device of FIGS. 1A to 1D, the semiconductor die 12 is one or more of a wide bandgap semiconductor die, a SiC die, or a GaN die.

According to an embodiment of the semiconductor device of FIGS. 1A to 1D, two or more semiconductor dies are disposed on the die carrier 11. For example, a first semiconductor die can be a transistor die, in particular one of the above mentioned transistor dies, and a second semiconductor die can be either a further transistor die or a diode die. The transistor dies may function as switches, and two switches can be connected in series or in parallel.

According to an embodiment of the semiconductor device of FIGS. 1A to 1D, the insulation layer 14 can be applied in different aggregate states as, for example, in liquid form, as pellets, as a granulate, or as a laminate of any kind of plastic material. Moreover, the insulation layer 14 can be made of a thermally conductive material to allow efficient heat dissipation in particular to the bottom. The material of the insulation layer 14 can, in particular, comprise a resin like epoxy resin, and more specifically a material filled with thermally conductive particles like, for example, made of AlO, BNi, AlNi, SiN, diamond, or any other thermally conductive particles. Also the top and bottom layers of the insulation layer 14 can be of different thermal conductivity. In particular, the bottom layer can have a higher thermal conductivity as heat dissipation to the top is already accomplished by the electrical interconnects. Accordingly the top layer can have a low or even zero amount of filler particles.

According to an embodiment of the semiconductor device 10, the electrical interconnects 15 can be fabricated by laser drilling through-vias into the encapsulant 13 and possibly also into the insulation layer 14 so that the through-vias reach down to the contact pads 12A of the semiconductor die 12 and thereafter filling an electrically conductive material like e.g. copper into the through-vias. In case of an IGBT die 12 the contact pads 12A on the upper surface may be comprised of a source or emitter pad and a gate pad. The source pad may be partitioned into a plurality of sub-pads and the electrical interconnects 15 may be connected with these sub-pads.

The embodiment as shown in FIG. 1A is so configured that the die carrier 11 comprises a planar upper surface and the semiconductor die 12 is disposed on the planar upper surface and further that the encapsulant 13 covers only a portion of the main face of the die carrier 11.

According to an embodiment of the semiconductor device 10, a thickness of the die carrier 11 can be in a range from 300 μm to 3 mm, wherein the lower bound of the range can also be 400 or 500 μm, and the upper bound of the range can also be 2.5 or 2 mm.

According to an embodiment of the semiconductor device 10, the die carrier 11 can be one of a portion of a leadframe, a direct copper bond (DCB) substrate, an active metal braze (AMB) substrate, or an isolated metal substrate (IMS).

FIGS. 1B to 1D illustrate the first steps of fabricating the semiconductor device 10. FIG. 1B shows a perspective view from above onto a leadframe which contains a plurality of die carriers 11 being interconnected within a frame structure. Onto each one of the die carriers 11 a semiconductor die 12 will be disposed and connected to the upper main face of the die carrier 11 by, for example, diffusion soldering. FIG. 1C shows an enlarged view onto the left upper portion of the leadframe. In the present embodiment the semiconductor dies 12 are IBGT dies each comprising on an upper main face thereof the contact pads 12A in the form of a large area source or emitter pad and a small area gate pad. It can be seen in FIG. 1C that the source pad may be partitioned into a plurality of sub-pads. The IGBT dies 12 further comprise a drain pad or collector pad on their back surfaces with which the IGBT dies 12 are connected with the upper surface of the die carriers 11. Thereafter the encapsulant 13 is individually applied onto each one of the IGBT dies 12. FIG. 1D shows the same view onto the assembly as FIG. 1C after applying the individual encapsulants 13.

The encapsulant 13 can be deposited by means of, for example, transfer molding or compression molding, or by lamination.

Figure 2A:
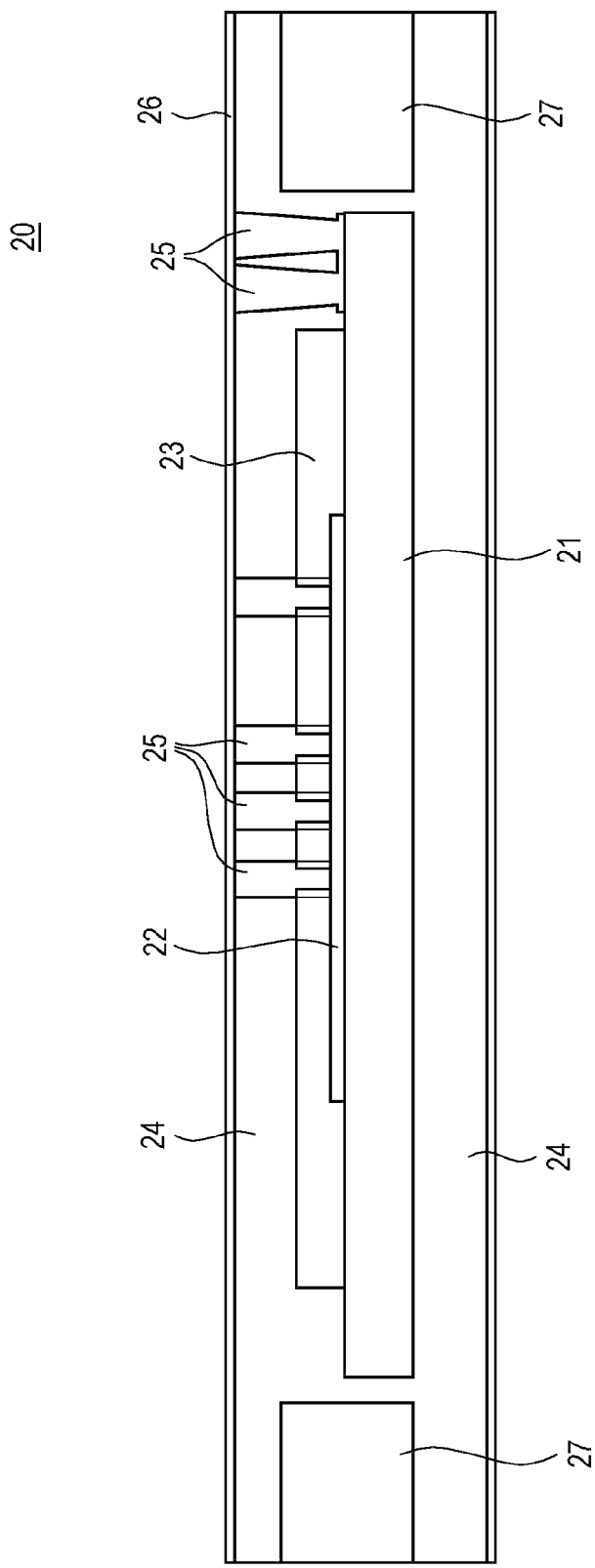
FIGS. 2A to 2D show schematic cross-sectional side view representations of an exemplary semiconductor device according to the first aspect, wherein the die carrier comprises a planar upper surface and the semiconductor die is disposed on the upper planar surface, and the encapsulant is disposed on the semiconductor die and on the complete upper planar surface and on the side faces of the die carrier (FIG. 2A), and a few first steps for fabricating the semiconductor module (FIGS. 2B to 2D).
Figure 2B:
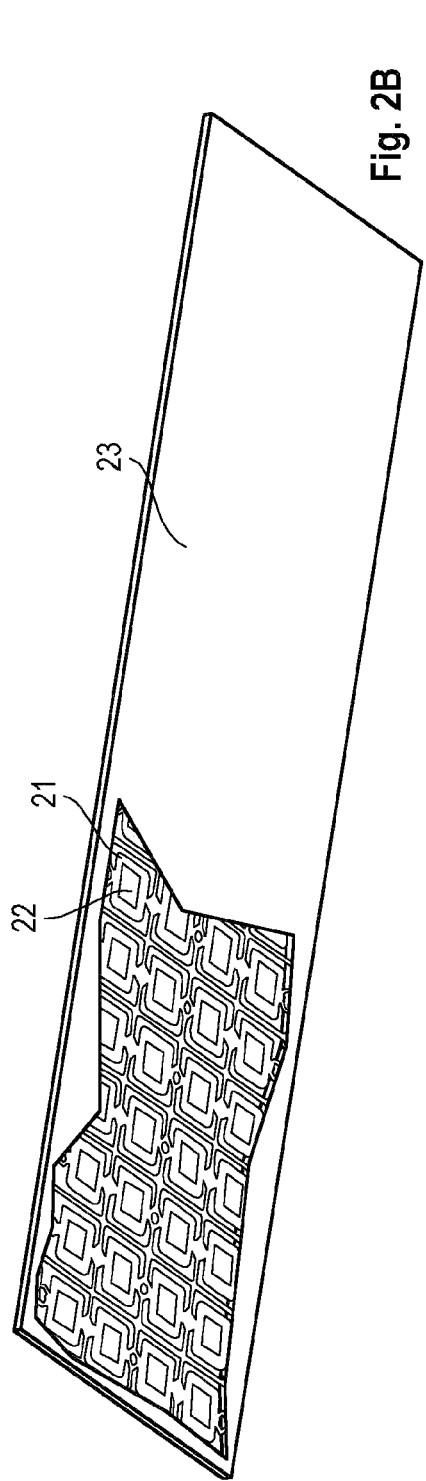
Figure 2D:
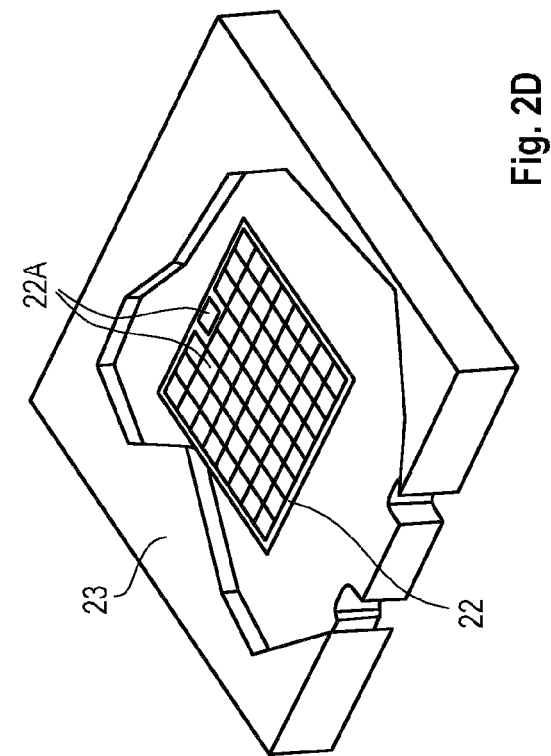
Figure 2C:
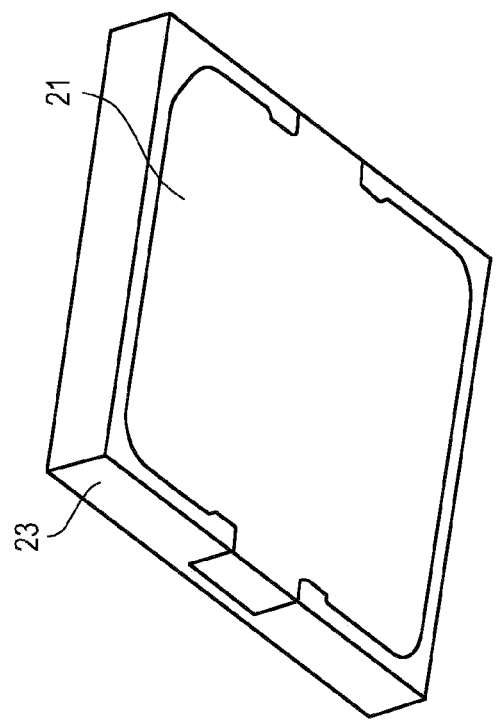

FIGS. 2A to 2D show schematic cross-sectional side view representations of an exemplary semiconductor device (FIG. 2A), and a few first steps for fabricating the semiconductor module (FIGS. 2B to 2D).

FIG. 2A shows a semiconductor device 20 comprising a leadframe based die carrier 21, a semiconductor die 22 disposed on a first upper main face of the die carrier 21, the semiconductor die 22 comprising one or more contact pads on a main face thereof, an encapsulant 23 covering the semiconductor die 22, the first upper main face and the side faces of the die carrier 21. The semiconductor device 20 further comprises an insulation layer 24 covering the encapsulant 23 and a plurality of electrical interconnects 25 each being connected with one of the contact pads of the semiconductor die 22 and extending through the encapsulant 23.

A difference of the semiconductor device 20 to the semiconductor device 10 of FIGS. 1A to 1D is that the encapsulant 23 is covered onto the complete upper main face and also on the side faces of the die carrier 21 and that the electrical interconnects 25 which connect the die carrier 21 with one of the of the metallic traces of the layer 26 extend through both the encapsulant 23 and the insulation layer 24. Accordingly the insulation layer 24 covers the die carrier 11 only on its second lower main face.

FIGS. 2B to 2D illustrate the first steps of fabricating the semiconductor device 20. FIG. 2B shows a perspective view from above onto a leadframe which contains a plurality of die carriers 21 being interconnected within a frame structure. Onto each one of the die carriers 21 a semiconductor die 22 will be disposed and connected to the upper main face of the die carrier 21 by, for example, diffusion soldering. As illustrated in FIG. 2B, in contrast to the method as shown in FIGS. 1B to 1D, in this embodiment the encapsulant 23 is applied to the complete structure so that the encapsulant 23 not only covers the entire upper surfaces of the semiconductor devices but also flows into the intermediate spaces between the semiconductor devices of the frame structure and thereby also covers the side faces of the die carriers 21. FIGS. 2C and 2D show a singulated semiconductor device in a perspective view from below (2C) and in a perspective view from above (2D) where it can be seen that the encapsulant 23 even is covered onto a small edge portion of the lower main face of the die carrier 21.

The die carrier 21, the semiconductor die 22, the contact pads 22A, the encapsulant 23, the insulation layer 24, the electrical interconnects 25, and the metallization layer 26 of the semiconductor device 20 may otherwise have the same properties as the die carrier 11, the semiconductor die 12, the contact pads 12A, the encapsulant 13, the insulation layer 14, the electrical interconnects 15, the metallization layer 16 of the semiconductor device 10.

Figure 3A:
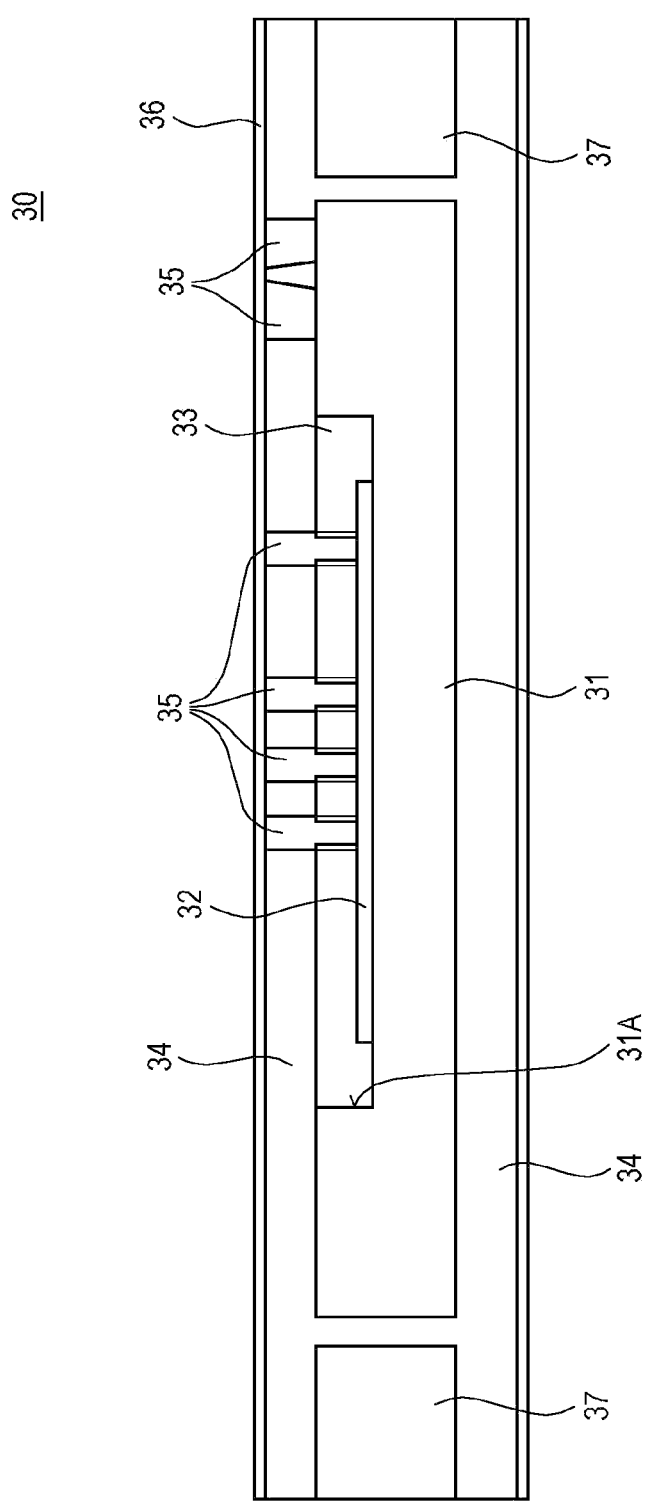
FIGS. 3A to 3D show schematic cross-sectional side view representations of an exemplary semiconductor device according to the first aspect, wherein the die carrier comprises a recessed area and the semiconductor die is disposed in the recessed area, and the encapsulant is disposed in the recessed area on the semiconductor die and a plurality of electrical through-connections is formed in the encapsulant (FIG. 3A) and a few first steps for fabricating the semiconductor module (FIGS. 3B to 3D).
Figure 3B:
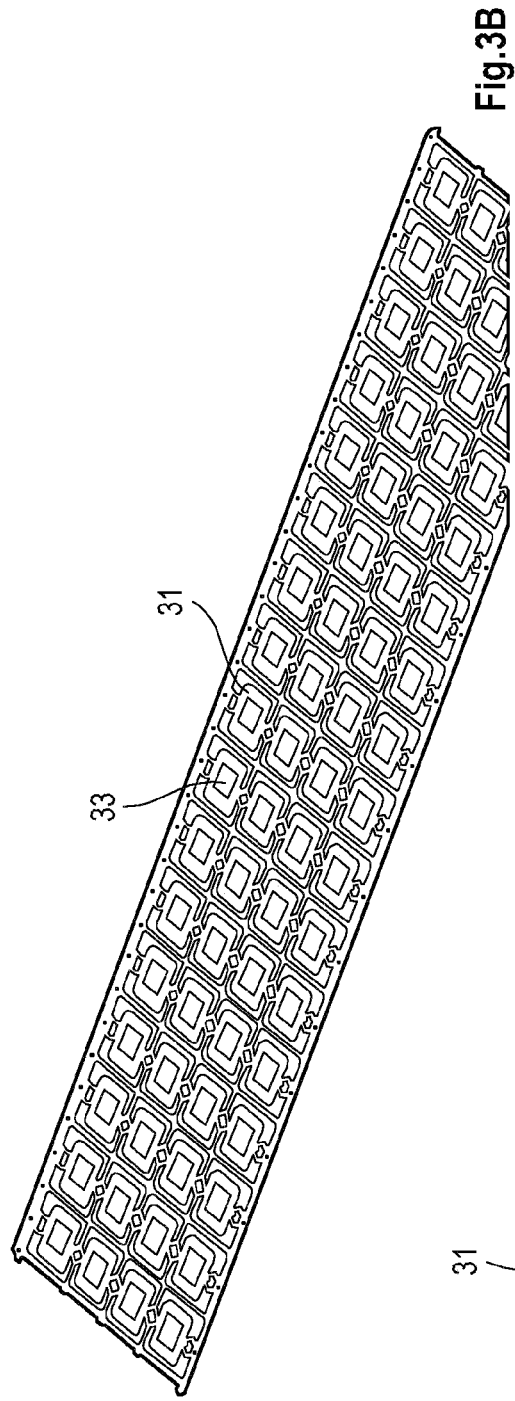
Figure 3D:
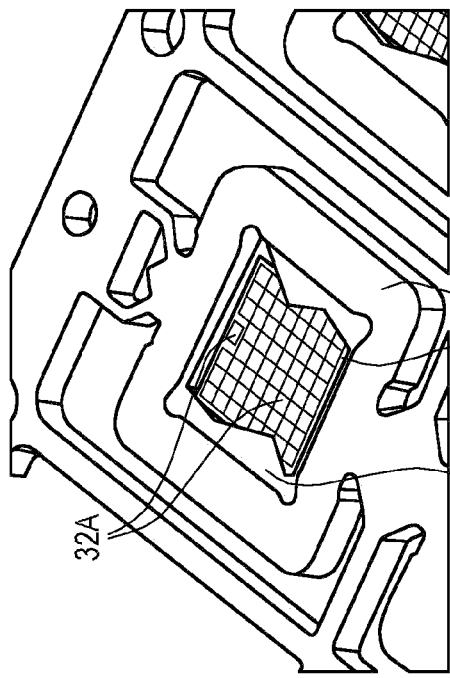
Figure 3C:
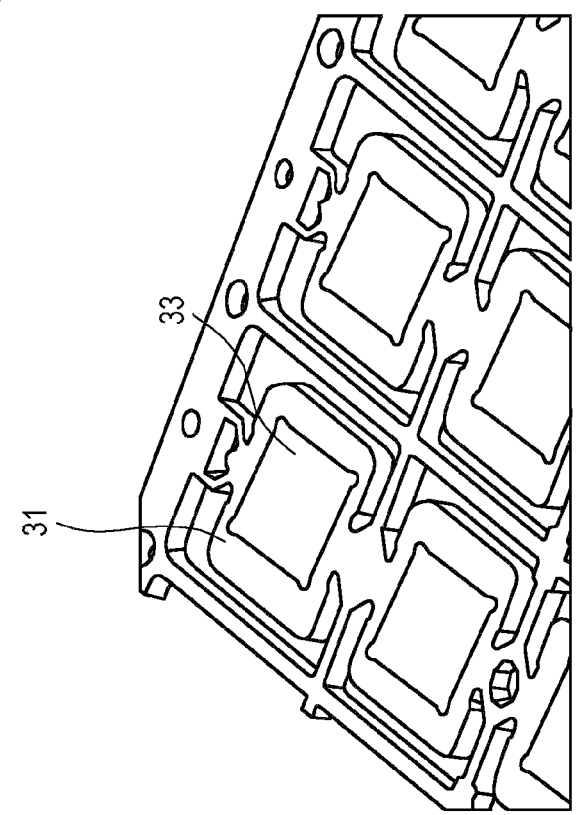

FIGS. 3A to 3D and shows a schematic cross-sectional side view representation of an exemplary semiconductor (FIG. 3A) and a few first steps for fabricating the semiconductor module (FIGS. 3B to 3D).

FIG. 3A shows a semiconductor device 30 comprising a leadframe based die carrier 31, which comprises a recessed area 31A in a first upper main face thereof, a semiconductor die 32 disposed in the recessed area 31A, the semiconductor die 32 comprising one or more contact pads on a main face thereof, an encapsulant 33 covering the semiconductor die 32 and the bottom and side faces of the recessed area 31A. The semiconductor device 30 further comprises an insulation layer 34 covering the first upper main face, the upper surface of the encapsulant 33 and side faces and a second lower main face of the die carrier 31, and a plurality of electrical interconnects 35 each being connected with one of the contact pads 32A of the semiconductor die 32 and extending through the encapsulant 33.

As shown in the embodiment of FIG. 3A, the encapsulant 33 can be filled into the recessed area 31A in such a way that its upper surface is coplanar with the upper surface of the die carrier 31.

According to an embodiment of the semiconductor device of FIGS. 3A to 3D, a depth of the recessed area 31A can be in a range from 0.2 mm to 2 mm, wherein the lower bound of the range can also be 0.3, 0.4, or 0.5 mm, and the upper bound of the range can also be 1.9, 1.8, 1.7, 1.6, or 1.5 mm and standard values can be 1.27 mm, 1 mm, 0.8 mm, 500 μm, and 300 μm.

The die carrier 31, the semiconductor die 32, the contact pads 32A, the encapsulant 33, the insulation layer 34, the electrical interconnects 35, and the metallization layer 36 of the semiconductor device 30 may otherwise have the same properties as the die carrier 11, the semiconductor die 12, the encapsulant 13, the insulation layer 14, the electrical interconnects 15, and the metallization layer 16 of the semiconductor device 10.

FIGS. 3B to 3D illustrate the first steps of fabricating the semiconductor device 30. FIG. 3B shows a perspective view from above onto a leadframe which contains a plurality of die carriers 31 being interconnected within a frame structure, each one of the die carriers 31 comprising a recessed area 31A. Into each one of the recessed areas 31A of the die carriers 31 a semiconductor die 12 will be inserted and connected to the bottom face of the recessed area 31A by, for example, diffusion soldering. FIG. 3C shows an enlarged view onto the left upper portion of the leadframe after filling the encapsulant 33 into the recessed areas 31A. FIG. 3D shows a perspective view onto the assembly with the encapsulant 33 partly broken away.

Figure 4A:
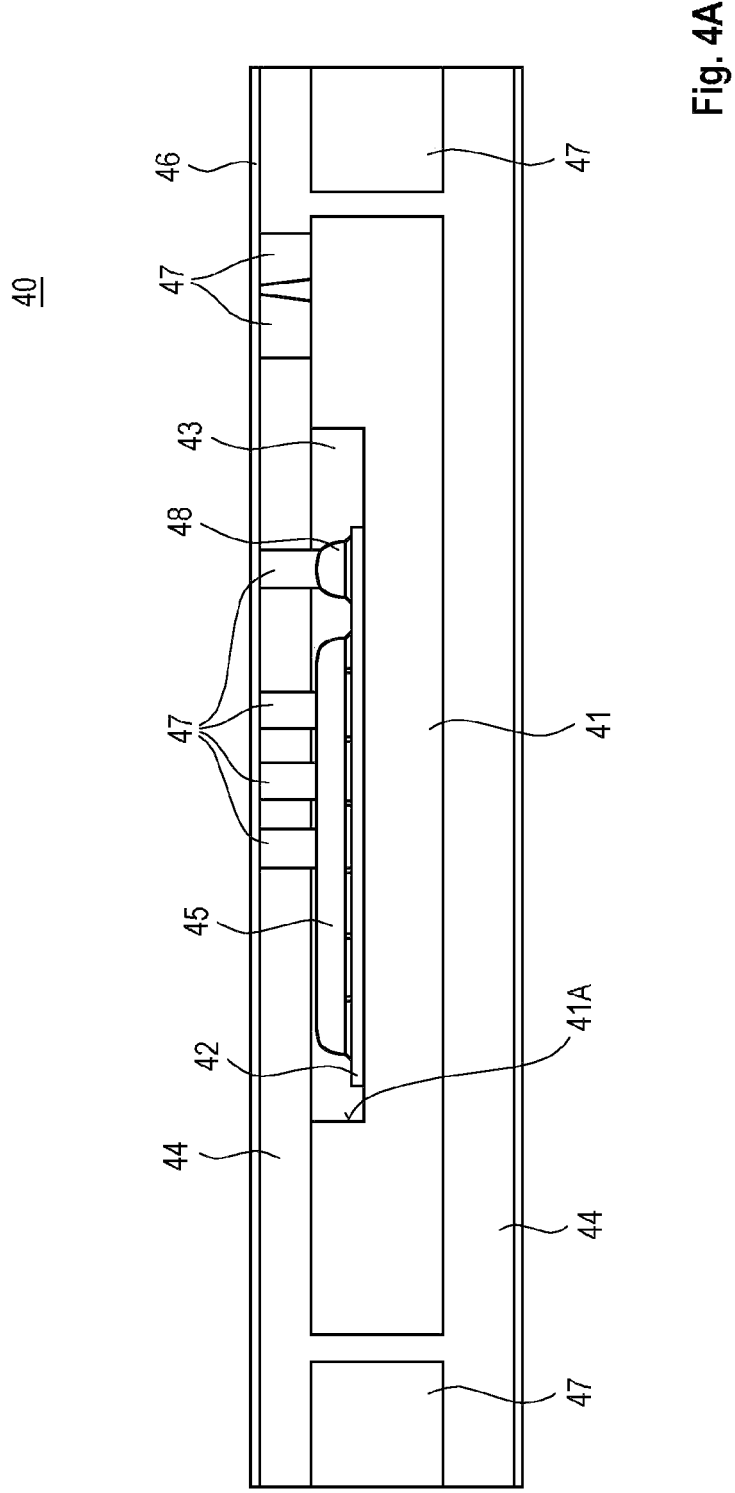
FIGS. 4A to 4D show schematic cross-sectional side view representations of an exemplary semiconductor device according to the first aspect, wherein the die carrier comprises a recessed area and the semiconductor die is disposed in the recced area, and large area electrical interconnects are provided which reach through the encapsulant (FIG. 4A) and a few first steps for fabricating the semiconductor module (FIGS. 4B to 4D).
Figure 4B:
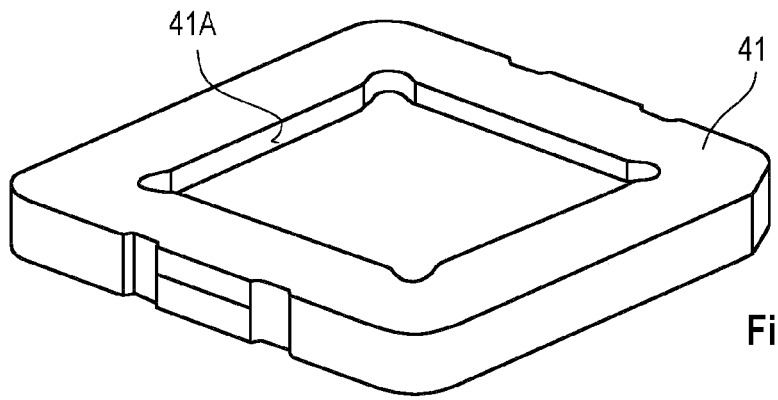
Figure 4C:
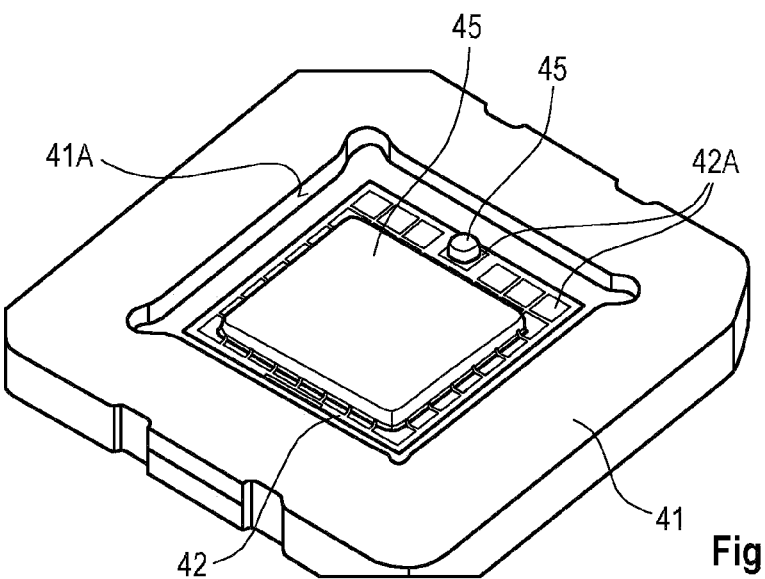
Figure 4D:
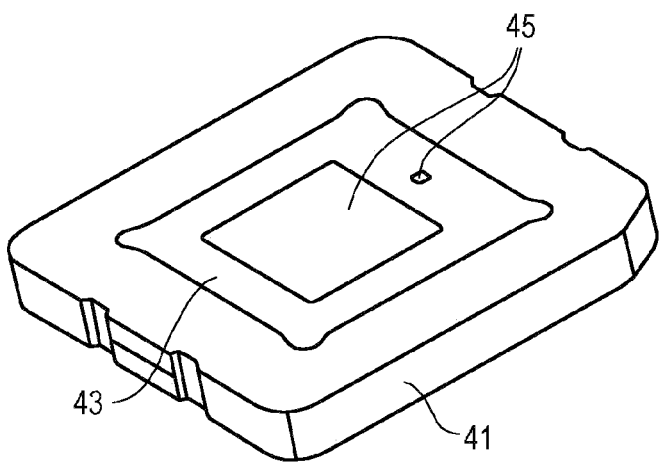

FIGS. 4A to 4D show schematic cross-sectional side view representations of an exemplary semiconductor device (FIG. 4A) and a few first steps for fabricating the semiconductor module (FIGS. 4B to 4D).

FIG. 4A shows a semiconductor device 40 comprising a leadframe based die carrier 41, which comprises a recessed area 41A in a first upper main face thereof, a semiconductor die 42 disposed in the recessed area 41A, the semiconductor die 42 comprising one or more contact pads 42A (not shown) on a main face thereof, an encapsulant 43 covering the semiconductor die 42 and the bottom and side faces of the recessed area 41A. The semiconductor device 40 further comprises an insulation layer 44 covering an upper surface of the encapsulant 43, the first upper main face, the side faces and a second lower main face of the die carrier 41, and first electrical interconnects 45 each being connected with one of the contact pads 42A of the semiconductor die 42 and extending through the encapsulant 43.

A difference of the semiconductor device 40 to the semiconductor device 30 of FIGS. 3A to 3D is that the first electrical interconnects 45 are formed in a different manner. More specifically, the first electrical interconnects 45 are applied in the form of massive contiguous blocks of a metallic material to the contact pads 42A of the semiconductor die 42. This can be done in different ways. One way is to pre-fabricate the metallic blocks as e.g. copper blocks and then the blocks can be applied to the contact pads 42A as a whole by, for example, adhering by use of a glue like silver glue. Another way of fabricating the first electrical interconnects 45 is to employ a gas dynamic cold spraying or cold spraying method wherein solid metal powders are accelerated in a supersonic jet to velocities up to ca. 1200 m/s. During impact with the substrate, particles undergo plastic deformation and adhere to the surface. To achieve a uniform thickness the spraying nozzle can be scanned along the substrate. Another way of fabricating the first electrical interconnects 45 is to apply vertical metallic wires to the contact pads before depositing the encapsulant and the insulation layer. In particular, the vertical wires can extend through an upper surface of the insulation layer.

A further difference of the semiconductor device 40 to the semiconductor device 30 of FIGS. 3A to 3D is that the first electrical interconnects 45 only extend through the encapsulant 43 but not through the insulation layer 44. Instead there are provided second electrical interconnects 47 on top of the first interconnects 45. These second interconnects 47 can be fabricated, for example, by drilling through-vias, in particular by a laser, into the insulation layer 44, and then filling the through-vias with a conductive material, in particular copper. The second interconnects 47 can then be connected with particular conductive traces of the metallization layer 46.

A thickness of the first electrical interconnects 45 can be in a range from 200 μm to 600 μm, wherein the lower bound can also be 250 μm or 300 mm, and the upper bound can also be 550 mm or 500 μm.

After fabricating the first electrical interconnects 45 in the above described manner, the encapsulant is 43 filled into the recessed areas 41A. Thereafter it is possible to remove upper protruding portions of the first electrical interconnects 45, in particular if upper surfaces of the first electrical interconnects 45 are not coplanar with an upper surface of the encapsulant 43. The removal process of these upper portions of the first electrical interconnects 45 can be performed by, for example, grinding or lasering.

According to an embodiment of the semiconductor devices 30 or 40, two or more recessed areas are disposed on the die carrier, wherein similar or different semiconductor dies can be arranged in the recessed areas. In case of different semiconductor dies, also different encapsulants can be employed for embedding the semiconductor dies according to different requirements as regards, for example, the voltage range of the semiconductor dies.

FIGS. 4B to 4D illustrate the first steps of fabricating the semiconductor device 40. FIG. 4B shows a perspective view from above onto a single die carrier 41 which comprises a recessed area 41A. Into the recessed area 41A of the die carrier 41 a semiconductor die 42 will be inserted and connected to the bottom face of the recessed area 41A by, for example, diffusion soldering. FIG. 4C shows a perspective view after placing first electrical interconnects 45 onto the contact pads 42A of the semiconductor die 42 by, for example, one of the above described methods. The first electrical interconnects 45 can be applied in such a way that their upper surfaces are coplanar with the upper surface of the die carrier 41. FIG. 4D shows a perspective view after filling the encapsulant 43 into the recessed area 41A. The encapsulant 43 can be filled into the recessed area 41A in such a way that its upper surface is coplanar with the upper surface of the die carrier 41 and the upper surfaces of the first electrical interconnects 45 are exposed to the outside.

The die carrier 41, the semiconductor die 42, the contact pads 42A, the encapsulant 43, the insulation layer 44, the first electrical interconnects 45, and the metallization layer 46 of the semiconductor device 40 may otherwise have the same properties as the die carrier 11, the semiconductor die 12, the contact pads 12A, the encapsulant 13, the insulation layer 14, the electrical interconnects 15, and the metallization layer 16 of the semiconductor device 10.

Figure 5:
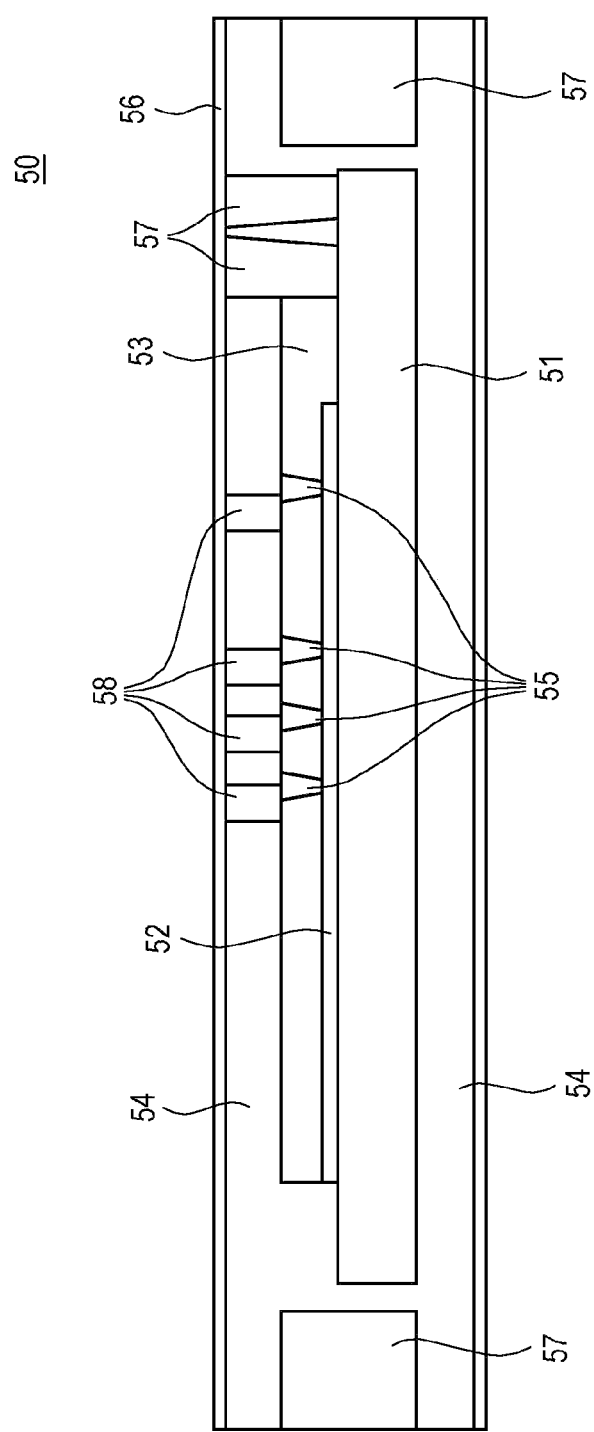
FIG. 5 shows a schematic cross-sectional side view representation of an exemplary semiconductor device according to the first aspect, wherein two types of electrical interconnects are provided wherein one type of them reach through the encapsulant and the other type of them reach through the insulation layer.

FIG. 5 shows a schematic cross-sectional side view representation of an exemplary semiconductor device according to the first aspect.

FIG. 5 shows a semiconductor device 50 which comprises a leadframe based die carrier 51, a semiconductor die 52 disposed on a first upper main face of the die carrier 51, the semiconductor die 52 comprising one or more contact pads on a main face thereof, an encapsulant 53 covering the semiconductor die 52 and at least a portion of the main face of the die carrier 51. The semiconductor device 50 further comprises an insulation layer 54 covering the encapsulant 53 and a portion of the first upper main face and a second lower main of the die carrier 51, and a plurality of first electrical interconnects 55 each one being connected with its lower end with one of the contact pads of the semiconductor die 52 and extending through the encapsulant 53. The semiconductor device 50 further comprises a plurality of second interconnects 57 each one being connected with its lower end with one of the first electrical interconnects 55. At their upper ends the second electrical interconnects 57 are connected with metallic traces 56. The die carrier 51 is also connected by second electrical interconnects 57 with one of the metallic traces 66. Again here it is alternatively possible that the die carrier 51 is contacted by electrical interconnects reaching via the backside portion of the insulation layer 54.

It should be mentioned that the first and second electrical interconnects 55 and 57 can be fabricated by forming vias by laser structuring into the encapsulant 53 and the insulation layer 54 followed by galvanic depositing or chemical plating or sputtering or printing a metal, in particular copper, into the vias. Furthermore the electrical interconnects 55 and 57 need not be arranged one above the other. As shown in the embodiment of FIG. 5, there can be a lateral displacement between them and a redistribution layer comprising metallic lines laterally connecting the ends of the electrical interconnects 55 and 57 with each other.

The die carrier 51, the semiconductor die 52, the encapsulant 53, the insulation layer 54, the electrical interconnects 55, and the metallization layer 56 of the semiconductor device 50 may otherwise have the same properties as the die carrier 11, the semiconductor die 12, the contact pads 12A, the encapsulant 13, the insulation layer 14, the electrical interconnects 15, and the metallization layer 16 of the semiconductor device 10.

One great advantage of the present disclosure is that throughout all the above described embodiments the electrical interconnects or at least part of the electrical interconnects can be fabricated by chemical plating, in particular electroplating or galvanic plating, or sputtering or printing. Interconnects formed in this way are known to be superior over all other types of electrical contacts. With this it becomes possible to fabricate semiconductor devices of high reliability and robustness.

Figure 6:
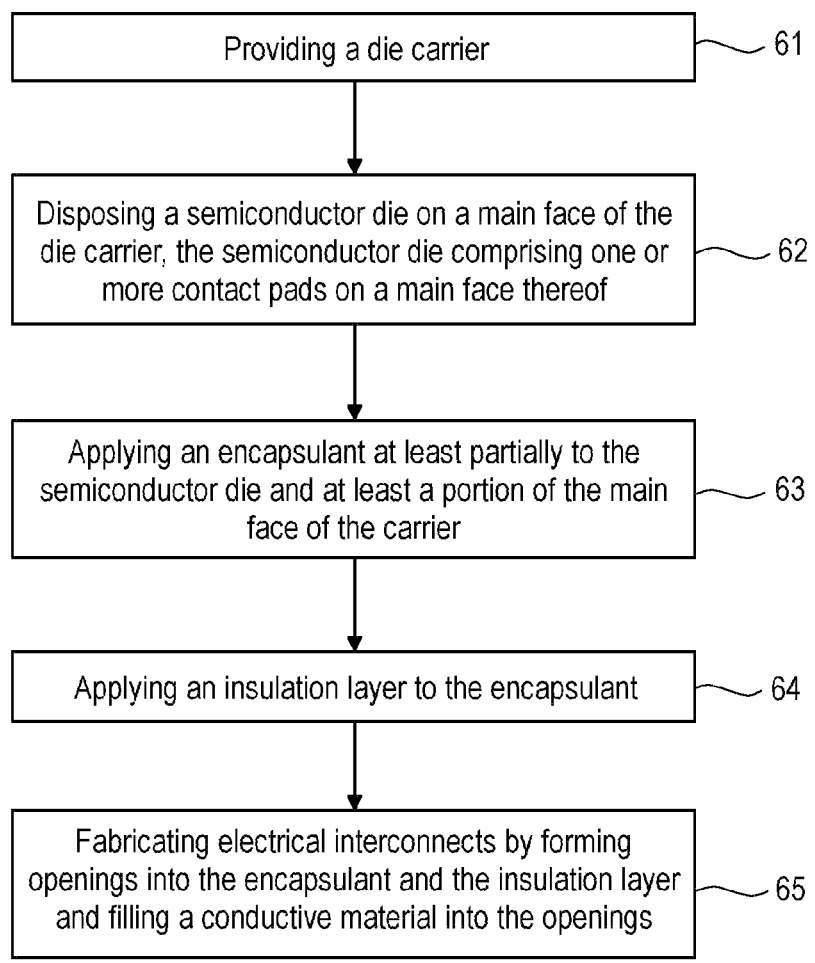
FIG. 6 shows a flow diagram of an exemplary method for fabricating a semiconductor device, wherein the electrical interconnects are fabricated after applying the encapsulant and the insulation layer.

FIG. 6 shows a flow diagram of an exemplary method for fabricating a semiconductor device in which method the electrical interconnects are fabricated after applying the encapsulant and the insulation layer.

The method 60 of FIG. 6 comprises providing a die carrier (61), disposing a semiconductor die on a main face of the die carrier, the semiconductor die comprising one or more contact pads on a main face thereof (62), applying an encapsulant at least partially to the semiconductor die and at least a portion of the main face of the die carrier (63), applying an insulation layer to the encapsulant (64), and fabricating electrical interconnects by forming openings into the encapsulant and the insulation layer and filling a conductive material into the openings (65).

With the method 60 of FIG. 6, for example, semiconductor devices as shown in FIGS. 1A to 3D can be fabricated. In case of the semiconductor 30 as shown in FIGS. 3A to 3D a die carrier 31 is provided which comprises a recessed area 31A.

Figure 7:
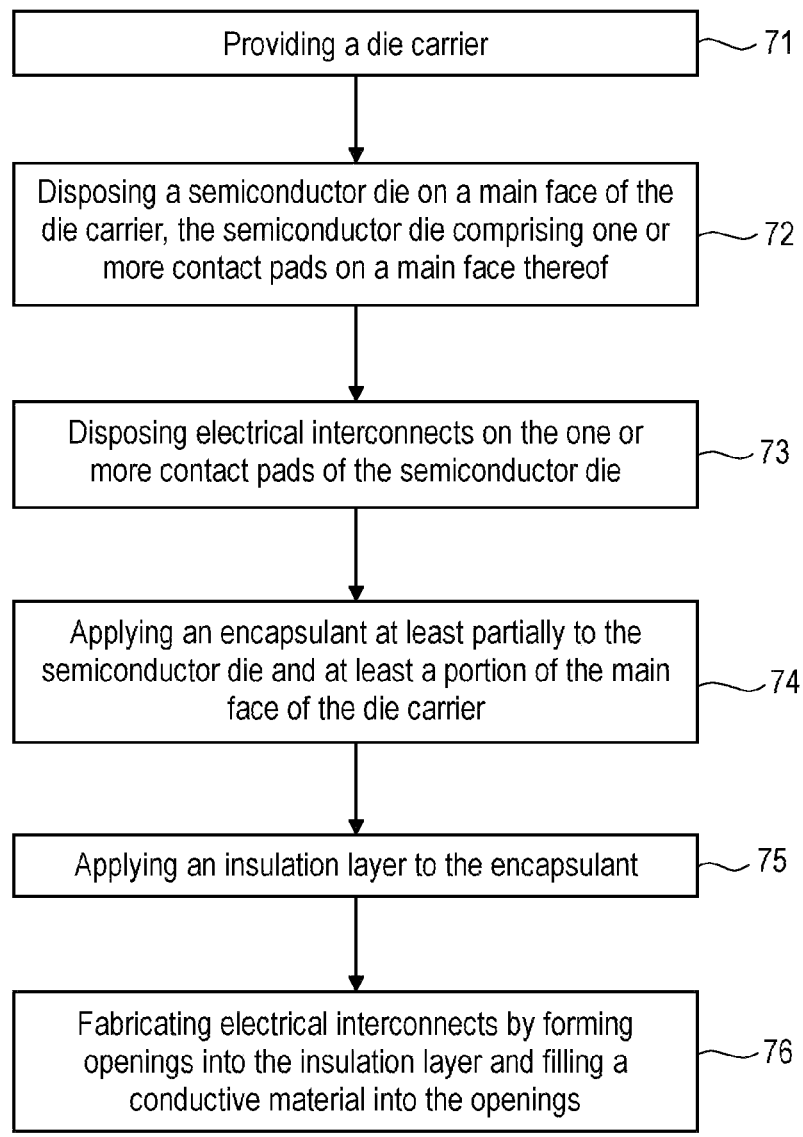
FIG. 7 shows a flow diagram of an exemplary method for fabricating a semiconductor device, wherein the electrical interconnects are fabricated before applying the encapsulant and the insulation layer.

FIG. 7 shows a flow diagram of an exemplary method for fabricating a semiconductor device in which method the electrical interconnects are fabricated before applying the encapsulant and the insulation layer.

The method 70 of FIG. 7 comprises providing a die carrier (71), disposing a semiconductor die on a main face of the die carrier, the semiconductor die comprising one or more contact pads on a main face thereof (72), disposing first electrical interconnects on the one or more contact pads of the semiconductor die (73), applying an encapsulant at least partially to the semiconductor die and at least a portion of the main face of the die carrier (74), applying an insulation layer to the encapsulant (75), and fabricating second electrical interconnects by forming openings into the insulation layer and filling a conductive material into the openings (76).

With the method 70 of FIG. 7, for example, a semiconductor device as shown in FIGS. 4A to 4D can be fabricated. In this case of the semiconductor device 40 as shown in FIGS. 4A to 4D a die carrier 41 is provided which comprises a recessed area 41A. The first electrical interconnects are shown with reference sign 45, and the second electrical interconnects are shown with reference sign 47.

According to an embodiment of the methods 60 and 70, the openings are formed into either both the encapsulant and the insulation layer (method 60) or only into the insulation layer (method 70) by laser drilling.

According to an embodiment of the method 70, the electrical interconnects are fabricated by one of pre-fabricating metallic blocks or wires and then applying the blocks or wires to the one or more contact pads, or by cold spraying.

According to an embodiment of the methods 60 and 70, the semiconductor die can be tested for functionality. The semiconductor die can, in particular, be tested before applying the encapsulant and the insulation layer. It can, however also be tested after applying the encapsulant and the insulation layer, in particular in case the electrical interconnects extending through an upper surface of the insulation layer.

Further embodiments of the method 60 can be formed by adding aspects or features which were described above in connection with the semiconductor device according to the first aspect.

In addition, while a particular feature or aspect of an embodiment of the disclosure may have been disclosed with respect to only one of several implementations, such feature or aspect may be combined with one or more other features or aspects of the other implementations as may be desired and advantageous for any given or particular application. Furthermore, to the extent that the terms "include", "have", "with", or other variants thereof are used in either the detailed description or the claims, such terms are intended to be inclusive in a manner similar to the term "comprise". Furthermore, it should be understood that embodiments of the disclosure may be implemented in discrete circuits, partially integrated circuits or fully integrated circuits or programming means. Also, the term "exemplary" is merely meant as an example, rather than the best or optimal. It is also to be appreciated that features and/or elements depicted herein are illustrated with particular dimensions relative to one another for purposes of simplicity and ease of understanding, and that actual dimensions may differ substantially from that illustrated herein.

Although specific embodiments have been illustrated and described herein, it will be appreciated by those of ordinary skill in the art that a variety of alternate and/or equivalent implementations may be substituted for the specific embodiments shown and described without departing from the scope of the present disclosure. This application is intended to cover any adaptations or variations of the specific embodiments discussed herein. Therefore, it is intended that this disclosure be limited only by the claims and the equivalents thereof.

What is claimed is:

1. A semiconductor device, comprising:
   a die carrier;
   a semiconductor die disposed on the die carrier, the semiconductor die comprising one or more contact pads;
   an encapsulant covering at least partially the semiconductor die and at least a portion of a main face of the die carrier;
   an insulation layer covering the encapsulant on an upper main face and on side faces of the encapsulant;
   one or more electrical interconnects, each being connected with one of the one or more contact pads of the semiconductor die and extending through the encapsulant; and
   a printed circuit board (PCB),
   wherein the die carrier is disposed within an opening portion of the PCB,
   wherein the insulation layer reaches through a space between side faces of the die carrier and side faces of the PCB to a backside of the die carrier and a backside of the PCB.

2. The semiconductor device of claim 1, wherein the die carrier comprises a planar main face and the semiconductor die is disposed on the planar main surface.

3. The semiconductor device of claim 2, wherein the encapsulant covers only a portion of the main face of the die carrier.

4. The semiconductor device of claim 1, wherein the encapsulant covers the complete main face and at least portions of side faces of the die carrier.

5. The semiconductor device of claim 1, wherein the die carrier comprises a recessed portion, and wherein the semiconductor die is disposed in the recessed portion.

6. The semiconductor device of claim 5, wherein the encapsulant is disposed in the recessed portion such that an upper surface of the encapsulant is coplanar with the main face of the die carrier.

7. The semiconductor device of claim 1, wherein the insulation layer comprises a laminate or a plastic material.

8. The semiconductor device of claim 1, wherein the one or more electrical interconnects also extend through the insulation layer.

9. A semiconductor device, comprising:
   a die carrier;
   a semiconductor die disposed on the die carrier, the semiconductor die comprising one or more contact pads;
   a single encapsulant covering at least partially the semiconductor die and at least a portion of a main face of the die carrier;
   an insulation layer covering the single encapsulant;
   one or more electrical interconnects, each being connected with one of the one or more contact pads of the semiconductor die and extending through the single encapsulant; and
   a printed circuit board (PCB),
   wherein the die carrier is disposed within an opening portion of the PCB,
   wherein the insulation layer reaches through a space between side faces of the die carrier and side faces of the PCB to a backside of the die carrier and a backside of the PCB.

10. The semiconductor device of claim 9, wherein the die carrier comprises a planar main face and the semiconductor die is disposed on the planar main surface.

11. The semiconductor device of claim 10, wherein the single encapsulant covers only a portion of the main face of the die carrier.

12. The semiconductor device of claim 9, wherein the single encapsulant covers the complete main face and at least portions of side faces of the die carrier.

13. The semiconductor device of claim 9, wherein the die carrier comprises a recessed portion, and wherein the semiconductor die is disposed in the recessed portion.

14. The semiconductor device of claim 13, wherein the single encapsulant is disposed in the recessed portion such that an upper surface of the single encapsulant is coplanar with the main face of the die carrier.

15. The semiconductor device of claim 9, wherein the insulation layer comprises a laminate or a plastic material.

16. The semiconductor device of claim 9, wherein the one or more electrical interconnects also extend through the insulation layer.

17. The semiconductor device of claim 9, wherein two or more semiconductor dies are disposed on the die carrier.

18. The semiconductor device of claim 9, wherein the semiconductor die is a vertical transistor die, a MOSFET die, an IGBT die, a SiC-MOS Die, a Cool-MOS die, an S-FET die, a gate driver die, a controller, or a connectivity die.

\* \* \* \* \*